(12) United States Patent
Sekine

(10) Patent No.: US 8,027,025 B2
(45) Date of Patent: Sep. 27, 2011

(54) EXPOSURE APPARATUS AND DEVICE MANUFACTURING METHOD

(75) Inventor: Yoshiyuki Sekine, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 469 days.

(21) Appl. No.: 12/145,639

(22) Filed: Jun. 25, 2008

(65) Prior Publication Data

US 2009/0002667 A1 Jan. 1, 2009

(30) Foreign Application Priority Data

Jun. 27, 2007 (JP) ................................. 2007-169487

(51) Int. Cl.
G03B 27/54 (2006.01)
G03B 27/42 (2006.01)
(52) U.S. Cl. .......................................... 355/67; 355/53
(58) Field of Classification Search ................. 355/52, 355/53, 55, 67–71; 356/399–401
See application file for complete search history.

(56) References Cited

U.S. PATENT DOCUMENTS

| 5,684,565 A * | 11/1997 | Oshida et al. ................... 355/53 |
| 7,817,249 B2 * | 10/2010 | Uehara ............................ 355/70 |
| 2006/0120629 A1 | 6/2006 | Myers et al. |

FOREIGN PATENT DOCUMENTS

| JP | 05-347239 A | 12/1993 |
| JP | 08-008178 A | 1/1996 |
| JP | 10-050585 | * 2/1998 |
| JP | 10-050585 A | 2/1998 |
| JP | 10-064790 A | 3/1998 |
| JP | 2005-311020 A | 11/2005 |

* cited by examiner

Primary Examiner — Hung Henry Nguyen
(74) Attorney, Agent, or Firm — Canon U.S.A., Inc. IP Division

(57) ABSTRACT

An exposure apparatus which exposes a substrate with exposure light, includes a projection optical system which projects a pattern image of an original onto the substrate; a first illumination unit which illuminates the original with the exposure light; and a second illumination unit which guides illumination light that is different from the exposure light for exposing the substrate to the projection optical system, the second illumination unit includes a modifier which modifies an illumination distribution of the illumination light entering an optical element near a pupil of the projection optical system and an optical element which is the closest to the original in the projection optical system.

20 Claims, 10 Drawing Sheets

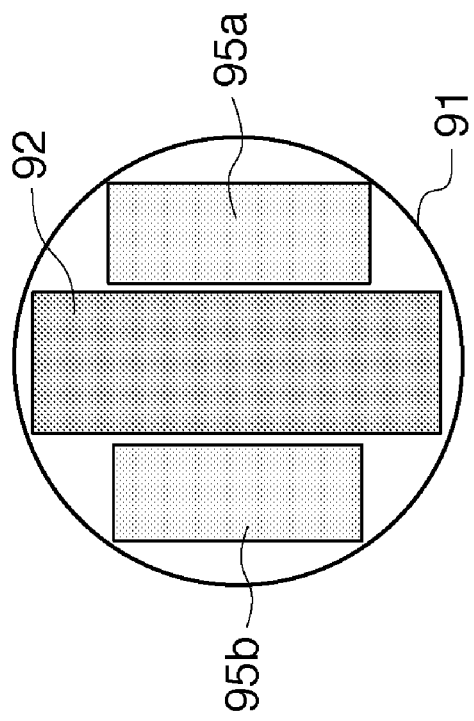
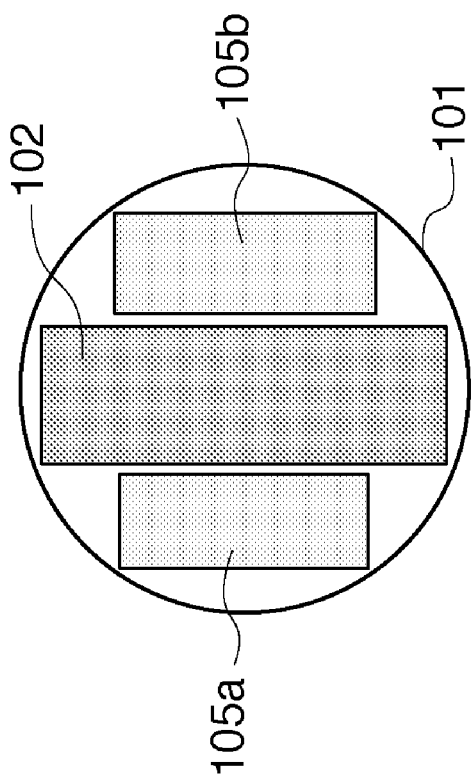
FIG. 10A
FIG. 10B

EXPOSURE APPARATUS AND DEVICE MANUFACTURING METHOD

BACKGROUND OF THE INVENTION

1. Field of the Invention

The present invention relates to an exposure apparatus and device manufacturing method.

2. Description of the Related Art

An exposure apparatus is used in the manufacture of a micropattern employed in various types of devices such as semiconductor device and liquid crystal devices, and micromechanics. As the devices and the like manufactured by the exposure apparatus shrink in feature size, the exposure wavelength is becoming short from that (248 nm) of KrF to that (193 nm) of ArF. Furthermore, attempts are being made to extend the limitations of photolithography by introducing the immersion exposure technique to the ArF wavelength, so that an equivalent wavelength of 134 nm is achieved.

Micropatterning is one of the most significant factors that support the dynamics of the semiconductor industry. Ever since the days when a resolution of 0.25 μm was required of a 256M DRAM, the micropatterning generation is rapidly changing to 180 nm, 130 nm, and even 100 nm.

Lithography up to i-line (365 nm) has not employed a resolution equal to or less than the wavelength. Although KrF has a wavelength of 248 nm, however, it has been employed for a line width of 180 nm and furthermore 130 nm.

Hence, an epoch has finally arrived when a resolution equal to or less than the wavelength is put into practical use by making good use of the development in resist and the accomplishment in the ultrahigh resolution technologies and the like. A line width ⅓ the wavelength in a line-and-space pattern is coming into view if various types of ultrahigh resolution technologies are fully utilized.

In this situation, line width control is currently the most significant issue. The committee of ITRS (International Technology Roadmap for Semiconductors) which draws a technology roadmap for the semiconductor industry continues to propose specifications that future semiconductor elements should satisfy.

According to the ITRS committee, among various items of lithography, line width control (CD control) will encounter its limitations the earliest. The items contributing to line width control vary to include the exposure apparatus, reticle, and process. How to decrease the values of the respective items to the limits to improve the controllability is the major issue.

One of the major factors that improve the line width controllability is the projection optical system of the exposure apparatus, and particularly the aberration of the projection optical system is one significant item. Hence, how to decrease aberration is always a major issue, and many efforts have been made to achieve this. Reviewing the past ten years, aberration decrease has advanced a great deal. For example, line width controllability with a value falling well below 10 mλ, when expressed by a Zernike series expanded to include as many terms as down to the 36th term which serves as a main value, has been realized.

Note that the aberration described above refers to the aberration unique to the projection optical system due to the design value, errors in assembly and adjustment, nonuniformity in glass material, and the like. As is well known, the semiconductor manufacture employs the exposure method of illuminating a reticle pattern and transferring and projecting light transmitted through the reticle pattern onto a wafer surface through a projection optical system. The glass material used in the projection optical system has very high transmittance for the wavelength of light employed for exposure but slightly absorbs exposure light so that its temperature rises. This temperature rise changes the refractive index of the glass material and deforms the surface shape to generate aberration. This aberration is called exposure aberration.

Exposure aberration must be decreased because it also degrades various types of optical characteristics including line width controllability. Among methods of decreasing exposure aberration, the most basic decreasing methods include a method of correcting an error in focal position caused by exposure aberration by moving the wafer stage, and a method of correcting fluctuations in imaging magnification by moving some of the lenses.

The amount and characteristics of exposure aberration change depending on the exposure method and exposure conditions, and accordingly exposure aberration must be corrected in accordance with the individual characteristics. For example, in a step-and-repeat exposure apparatus or a so-called stepper, that portion of a reticle through which light is transmitted is close to a square, which is almost rotationally symmetric if the density in pattern arrangement does not largely change. Therefore, a highly symmetric correction method of heating the periphery of the lens entirely, as described in Japanese Patent Laid-Open No. 5-347239, can be employed in addition to focal position misalignment correction and imaging magnification correction.

In an exposure apparatus employing the step and scan method or a so-called scanner, the reticle side light-transmitting region is rectangular (typically, the ratio in length of the long side to the short side is larger than 3). Accordingly, that portion of each of at least lenses near the reticle and wafer which is irradiated with light is almost rectangular. Considering the fact that light absorption and heat generation occur in this region, changes in refractive index and surface shape also occur near the irradiation region. Hence, a rotationally asymmetric component, mainly astigmatism, which is not large in the stepper, occurs in the scanner. To cope with this, methods are proposed such as a method of enabling partial lens heating, as in Japanese Patent Laid-Open No. 8-8178, and a method of employing light having a wavelength different from that used for exposure so that the pattern on the reticle-side image plane becomes almost rotationally symmetric, as in Japanese Patent Laid-Open No. 10-50585.

Of exposure conditions that change the exposure aberration, the illumination condition is the most important. Considering a case in which no pattern is arranged on the reticle and light is transmitted through the reticle completely, an effective light source given as an illumination condition forms an image near the pupil of the projection optical system. If taking into account only 0th-order diffracted light which usually contributes to light transmission the most among light diffracted by the reticle, the same applies even to a case in which a pattern is arranged on the reticle.

As a technique effective for improving the resolution, an oblique-incidence illumination method (also called deformed illumination as well) is known. According to this method, the light source is arranged at a position away from an optical axis which is the rotationally symmetric axis of the projection optical system. The shape of this light source includes a zone type, quadrupole type, dipole type, and the like. A lens near the pupil of the projection optical system focuses light from an effective light source and absorbs light to generate heat. Particularly, when the light source is of the dipole type or the like, the region of the lens irradiated with light is limited, thus causing astigmatism. Regarding this problem, Japanese Patent Laid-Open Nos. 8-8178 and 2005-311020 disclose a method of partially heating a lens in question to form an almost rotationally symmetric temperature distribution and correcting the remaining aberration. Also, Japanese Patent Laid-Open No. 10-64790 discloses a method of arranging a light source, having a wavelength different from the exposure wavelength, at a position not used for oblique-incidence illumination.

Currently, the state-of-the art semiconductor element manufacture employs a scanner, and quadrupole illumination and dipole illumination are employed as a standard practice to improve the resolution. Accordingly, rotationally asymmetric exposure aberration occurs due to the influence of lenses near the reticle and wafer and a lens near the pupil of the projection optical system. Hence, demands have arisen to correct the lenses near the reticle and wafer and the lens near the pupil of the projection optical system simultaneously. In addition, line width control requires higher accuracy so that it can correct and decrease even an aberration component of a higher order (e.g., the 17th term or more when expressed by a Zernike series) than in the conventional case. In view of these demands, to correct the lenses near the reticle and wafer and the lens near the pupil of the projection optical system simultaneously, a correction mechanism may be mounted for each lens, so that each lens is controlled independently.

Japanese Patent Laid-Open Nos. 10-50585 and 2005-311020 described above are based on this idea, but have limitations that, for example, correction mechanisms must be mounted for a plurality of lenses, and if the lenses are arranged close to each other as in the projection optical system of a semiconductor exposure apparatus, a temperature rise for the purpose of correction needs to be able to be added for only the peripheral portions of the lenses. If light must be guided by oblique incidence, as in the latter case, when reflected light or transmitted light irradiates a lens other than the lens to be corrected, a holding portion for such a lens, or a lens barrel of such a lens, it may also cause exposure aberration. Based on these possibilities, exposure aberration correction must be performed in the entire projection optical system using a simple arrangement.

SUMMARY OF THE INVENTION

The present invention has been made in view of the above problems, and has as its object to realize a simple exposure technique which simultaneously corrects high-order heat aberration caused by complicated deformed illumination and asymmetric thermal aberration caused by a slit-like object.

In order to solve the above problems, according to the present invention, there is provided an exposure apparatus which exposes a substrate with exposure light, comprising: a projection optical system which projects a pattern image of an original onto the substrate; a first illumination unit which illuminates the original with the exposure light; and a second illumination unit which guides illumination light that is different from the exposure light for exposing the substrate to the projection optical system, wherein the second illumination unit includes a modifier which modifies an illumination distribution of the illumination light entering an optical element near a pupil of the projection optical system and an optical element which is the closest to the original in the projection optical system.

According to the present invention, there is also provided an exposure apparatus which exposes a substrate with exposure light, comprising a projection optical system which projects a pattern of an original onto the substrate; a first illumination unit which illuminates the original with the exposure light; a second illumination unit which guides illumination light from a light source different from that of the exposure light to the projection optical system; and an optical path modification unit which modifies a traveling direction of the illumination light, emerging from the second illumination unit and entering the projection optical system, from toward the substrate to toward the original.

According to the present invention, there is provided a device manufacturing method comprising: a step of exposing a substrate using an exposure apparatus as recited above; and a step of developing the exposed substrate.

According to the present invention, asymmetric aberration caused by heat absorption in exposure when deformed illumination is employed can be decreased with a simple arrangement. This can implement a projection optical system having highly accurate line width controllability.

Further features of the present invention will become apparent from the following description of exemplary embodiments (with reference to the attached drawings).

BRIEF DESCRIPTION OF THE DRAWINGS

FIG. 10A is a view showing an illumination distribution on an optical element near the reticle obtained by the optical path modification unit; and FIG. 10B is a view showing an illumination distribution on an optical element near the wafer.

DESCRIPTION OF THE EMBODIMENTS

The best mode for carrying out the present invention will be described in detail below with reference to the accompanying drawings.

Note that the embodiments to be described below are merely examples to realize the present invention and should be changed or modified where necessary in accordance with the arrangement and the various conditions of the apparatus to which the present invention is applied. The present invention is not thus limited to the following embodiments.

The present invention can also be achieved when a storage medium storing the program codes of the software that implements the functions of the embodiments to be described hereinafter is supplied to an exposure apparatus and the program codes stored in the storage medium are read out and executed by the computer (or the CPU or MPU) of the exposure apparatus.

First Embodiment

Figure 1:
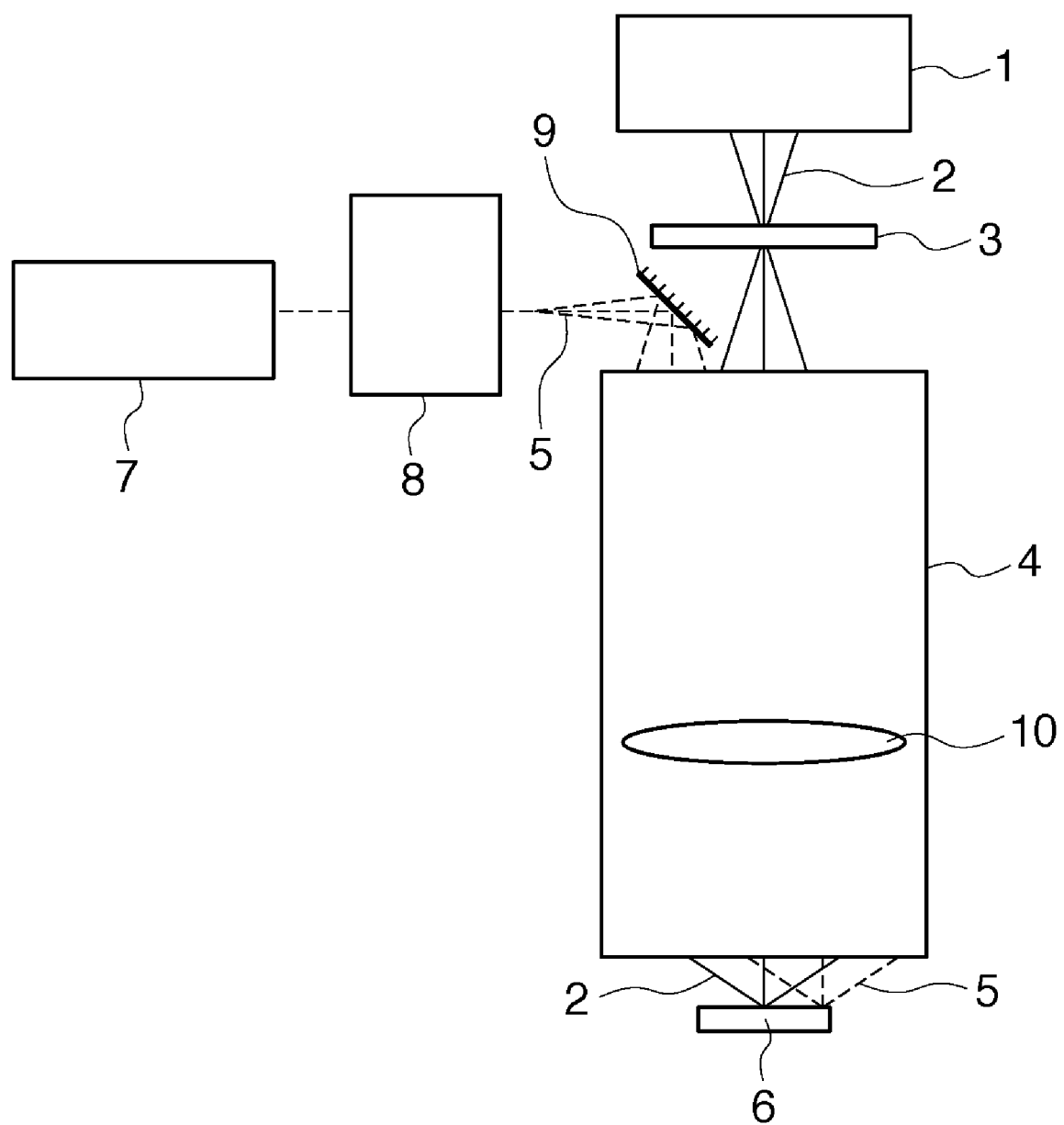
FIG. 1 is a view showing a projection exposure apparatus according to the first embodiment.

FIG. 1 is a view showing a projection exposure apparatus according to the first embodiment of the present invention.

Referring to FIG. 1, reference numeral 1 denotes an exposure light source which supplies exposure light 2 to illuminate a reticle. The exposure light 2 illuminates a reticle 3 with desired illumination characteristics by an illumination optical system (not shown). This illumination system can employ any known technique, e.g., complicated deformed illumination by means of a computer generated hologram (CGH). Light which illuminates the reticle 3 is diffracted to enter a projection optical system 4 to finally form an image on a wafer (substrate) 6.

The characteristic feature of this embodiment resides in that, in addition to the exposure light source 1 serving as the first illumination unit, a non-exposure light source 7 serving as the second illumination unit and a spatial modulation unit 8 are provided. Non-exposure light 5 emitted by the non-exposure light source 7 and not contributing to exposure is to enter the projection optical system 4 via the spatial modulation unit 8 along an optical path different from that of the exposure light 2. In FIG. 1, the non-exposure light 5 is guided to the projection optical system 4 through a bend mirror 9 so as not to interfere with the optical path of the exposure light 2.

The non-exposure light 5 can reach the wafer 6 via the projection optical system 4. The wafer 6 is coated with a resist (not shown) which is photosensitive to the wavelength of the exposure light 2. If the wavelength of the non-exposure light 5 is near that of the exposure light 2, the resist is photosensitized by the non-exposure light 5 as well. Then, a desired pattern image may not be obtained. To avoid this, the wavelength of the non-exposure light 5 may be set to such a value that the resist will not be photosensitized. Alternatively, by utilizing the fact that the non-exposure light 5 travels in the projection optical system 4 along the optical path different from that of the exposure light 2, the non-exposure light 5 may be shielded before reaching the wafer 6, as will be described later.

Figure 2A:
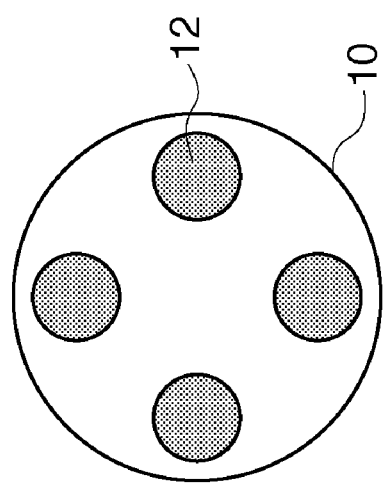
FIGS. 2A to 2C are views each showing an illumination distribution on an optical element near the pupil of the projection optical system according to the first embodiment.
Figure 2B:
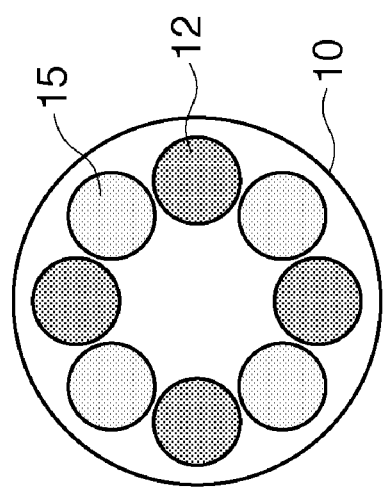
Figure 2C:
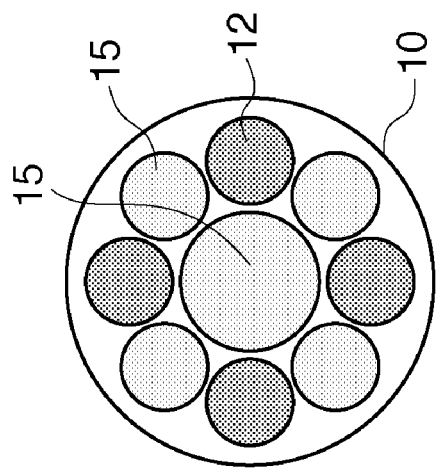

FIGS. 2A to 2C are views to explain the main function of the spatial modulation unit 8.

In each of FIGS. 2A to 2C, an optical element 10 arranged near the pupil of the projection optical system 4 in FIG. 1 is extracted and seen from the top or below. The exposure light source 1 (first illumination unit) imparts desired illumination characteristics necessary for exposure to the exposure light 2 by an illumination optical system (not shown), so that the exposure light 2 illuminates the reticle (original) 3. After the reticle 3 diffracts the exposure light 2, the exposure light 2 enters the projection optical system 4 to reach the optical element 10 near the pupil as one of optical elements that constitute the projection optical system 4. FIG. 2A shows an example of an illumination distribution 12 of the exposure light 2 on the optical element 10 near the pupil obtained at this time. The illumination distribution 12 is determined by the incidence characteristics for the reticle 3 which are formed by the illumination optical system and the diffraction characteristics of the pattern formed on the reticle 3. The illumination distribution 12 can also be obtained by calculation. In this embodiment, the illumination distribution 12 can be regarded to almost coincide with an effective light source distribution formed by the illumination optical system.

When the illumination distribution 12 as shown in FIG. 2A is formed on the optical element 10 near the pupil, the glass material used to form the optical element 10 generates heat because it slightly absorbs light, although it has a very high transmittance for the wavelength of the exposure light 2. Light absorption by an anti-reflection film (not shown) formed on the optical element 10 by coating and heat generation by the light absorption cannot also be negligible. When an optical element generates heat, its expansion deforms the surface shape, and its refractive index changes due to its temperature dependency. This generates aberration which degrades the image forming performance of the projection optical system 4.

Figure 3A:
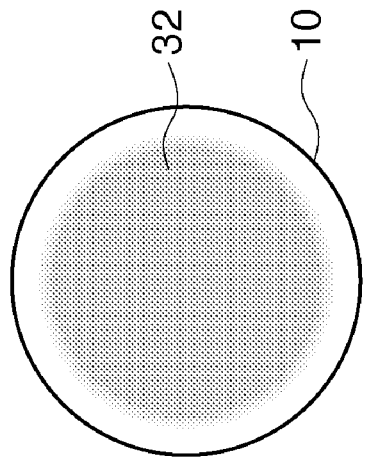
FIGS. 3A to 3C are views each showing a temperature distribution on the optical element near the pupil of the projection optical system according to the first embodiment.

Heat generation upon absorption of light of the illumination distribution 12 causes what surface deformation and what temperature rise in the optical element 10 near the pupil can be detected accurately by simulation of structural analysis and thermal analysis. Regarding temperature rise which largely influences thermal aberration, although its distribution slightly changes depending on heat diffusion, it can be regarded to almost coincide with the original illumination distribution 12, as represented by a temperature rising part 30 in FIG. 3A. As the illumination distribution 12 causes an almost similar refractive index distribution on the optical element 10 near the pupil, the generated thermal aberration is also aberration with rotational symmetry of four times. It is difficult to correct aberration having such dependency with an ordinary method.

Figure 3B:
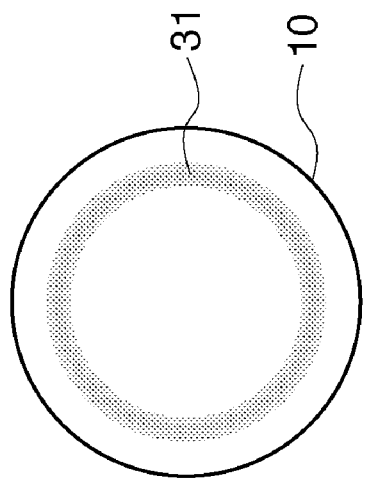

FIG. 2B shows a state in which a non-exposure light illumination distribution 15 is superposed on the illumination distribution 12 of the optical element 10 near the pupil. For example, when the wavelength of the non-exposure light is the same as that of the exposure light, if the non-exposure light illumination distribution 15 and illumination distribution 12 are combined to form an almost zone shape, heat generation by absorption of illumination light and a temperature distribution accompanying the heat generation become almost rotationally symmetric as shown in FIG. 3B. Accordingly, heat aberration also becomes nearly rotationally symmetric, and can be mostly corrected by an ordinary spherical aberration correction technique. If the wavelength of the non-exposure light is different from that of the exposure light, absorption by a film and glass material changes. Once the wavelength is determined, the absorption amounts can be determined accurately. Therefore, heat generation and temperature distribution can be made almost rotationally symmetric by controlling the illuminance and energy of the non-exposure light illumination distribution 15 carefully.

Figure 3C:
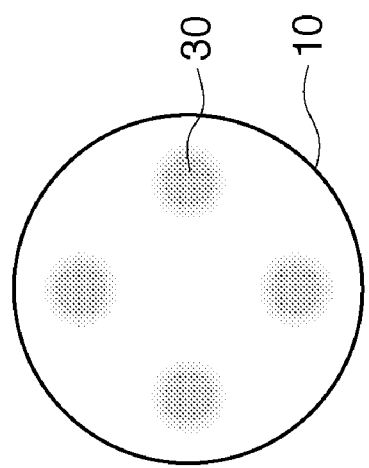

In FIG. 2C, when compared to FIG. 2B, a non-exposure light illumination distribution 15 is formed to cover near the center of the optical element 10 near the pupil as well, so that the element is illuminated not to form a zone shape but entirely uniformly. In the zone shape in FIG. 2B, high-order spherical aberration occurs, and it may be difficult to correct this spherical aberration with an ordinary spherical aberration correction technique. If, however, the element is illuminated uniformly and a temperature rising part 32 is uniformly distributed on almost the entire element, as shown in FIG. 3C, correction can be facilitated.

The non-exposure light illumination distribution 15 can be formed arbitrarily by controlling the spatial modulation unit 8. For example, if the wavelength of the non-exposure light is the same as that of the exposure light, a computer generated hologram which forms a desired non-exposure light illumination distribution 15 near the pupil of the projection optical system 4 may be arranged at a position equivalent to the reticle 3 to serve as the spatial modulation unit 8. The computer generated hologram can employ the same design method, the same manufacturing method, and the same glass material as those used in the illumination optical system which controls exposure light.

A turret provided with a plurality of computer generated holograms may be prepared in advance to be able to cope with a plurality of non-exposure light illumination distributions 15, as in, e.g., FIGS. 2B and 2C. Desirably, the intensity of the non-exposure light source 7 can be changed continuously among a plurality of levels, as in an ordinary light source. This is to correct temporal changes in temperature distribution, or so-called non-stationary aberration, since the start of exposure until a stationary state is attained is very important in the current mode of employment of the projection exposure apparatus, i.e., many product type, small production amount manufacture.

With the currently most popular ArF light (wavelength: 193 nm), a practical spatial modulation unit is limited. If, however, the wavelength of the non-exposure light is different from that of the exposure light, various types of techniques can be employed in place of the spatial modulation unit 8. For example, in addition to the computer generated hologram, a technique such as a liquid crystal panel, digital micromirror device (DMD), or the like that can change the non-exposure light illumination distribution 15 can be employed. To be able to change the non-exposure light illumination distribution 15 is significant as a technique to follow a change in illumination characteristics of the exposure light, a change in the reticle 3, a temporal change in temperature distribution since the start of exposure until the stationary state is attained, and the like.

Figure 4:
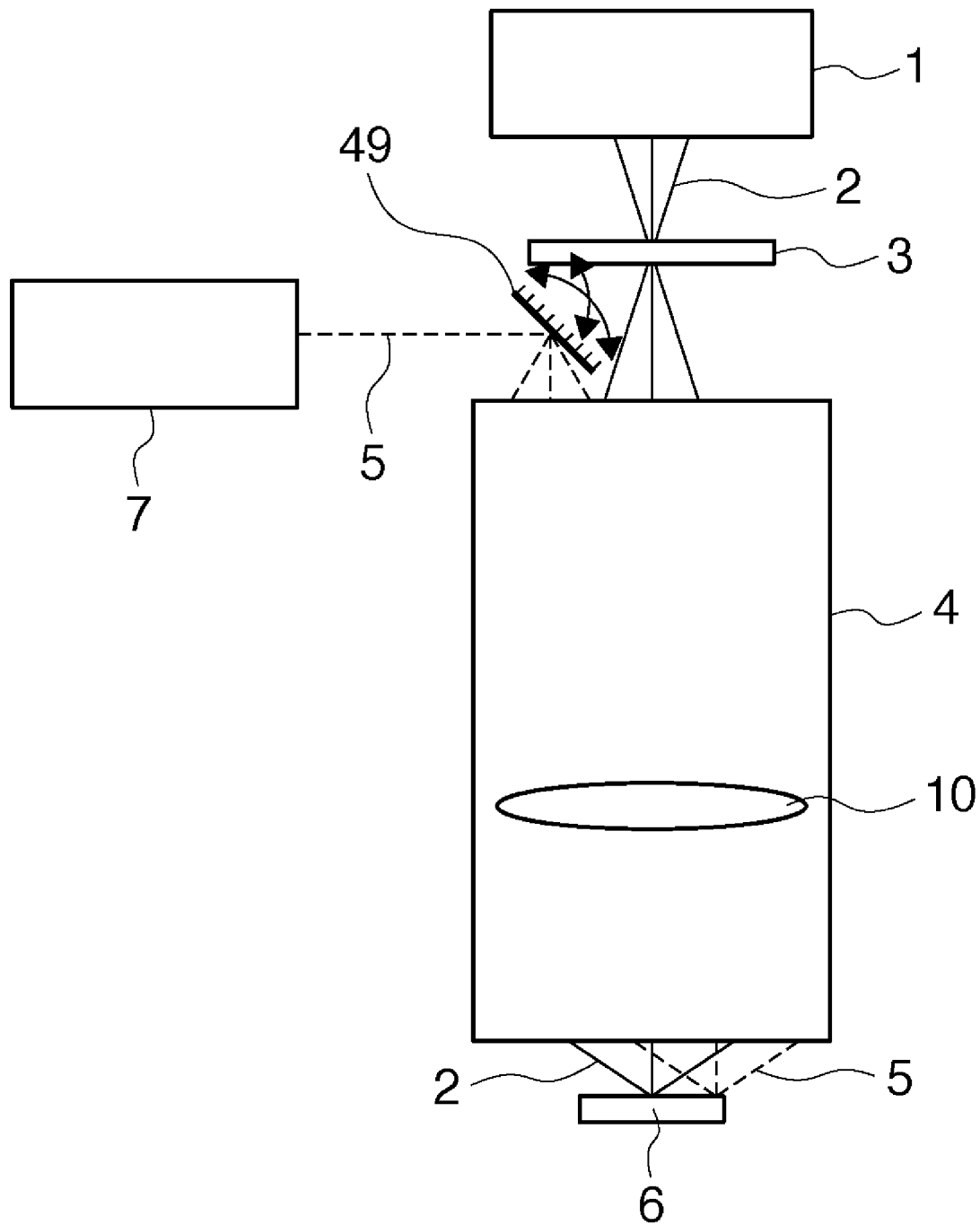
FIG. 4 is a view showing a modification of the first embodiment.

The function of the spatial modulation unit 8 can be replaced by a technique that scans in an angular direction. FIG. 4 shows a modification in which a scanning mirror 49 replaces the spatial modulation unit 8.

In FIG. 4, assume that the non-exposure light 5 from the non-exposure light source 7 is almost parallel light. If the scanning mirror 49 is fixed at a certain angle, the non-exposure light 5 reaches almost one point on the optical element 10 near the pupil. When the angle of the scanning mirror 49 is changed, the reaching point of the non-exposure light 5 on the optical element 10 changes. Hence, the optical element 10 can be scanned by scanning the mirror. As a result, the surface of the optical element 10 can be substantially imparted with an illuminance distribution by increasing the scanning speed to be sufficiently high and switching the non-exposure light source 7. This method has another advantage that it can be utilized regardless of the wavelength of the non-exposure light source.

According to this embodiment, the non-exposure light from the second illumination unit is guided from immediately under the reticle 3. To illuminate the optical element 10 near the pupil, the non-exposure light travels through the projection optical system 4 almost entirely. To cope with this, the second illumination unit may be arranged near the pupil of the projection optical system 4, or an optical element, the illumination distribution of which is to be particularly controlled, may adopt a film or glass material which efficiently absorbs the non-exposure light. With the existing projection optical system, since strict limitations are posed on the glass material, employment of a film is preferable as a countermeasure.

Second Embodiment

Figure 5:
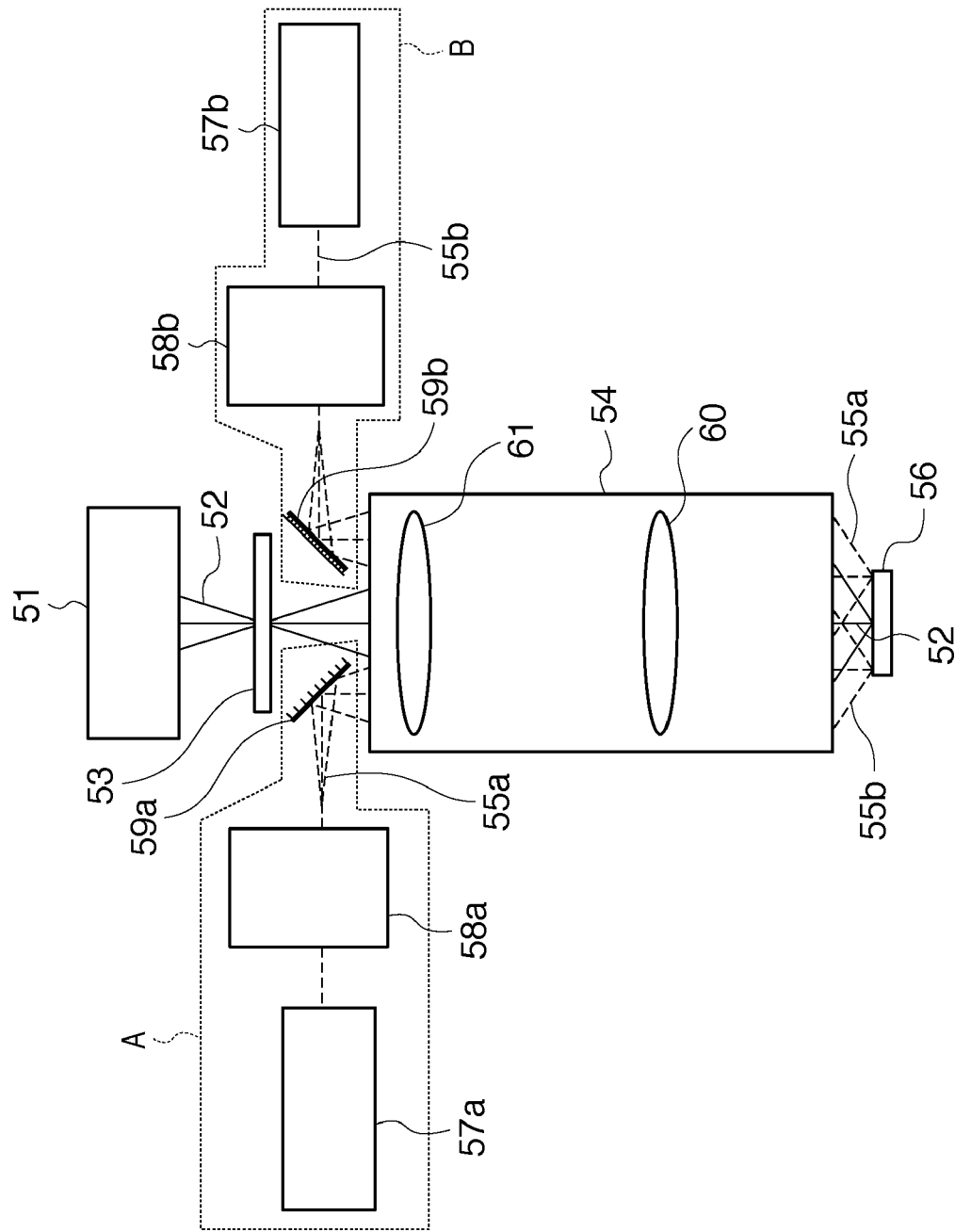
FIG. 5 is a view showing a projection exposure apparatus according to the second embodiment.

FIG. 5 is a view showing a projection exposure apparatus according to the second embodiment of the present invention.

Unlike the first embodiment, the second embodiment is provided with, as the second illumination unit, an illumination unit A comprising a non-exposure light source 57a, spatial modulation unit 58a, and bend mirror 59a, and an illumination unit B comprising a non-exposure light source 57b, spatial modulation unit 58b, and bend mirror 59b.

The illumination units A and B can each comprise one or a plurality of sets of all the features described in the first embodiment, and their functions with respect to an optical element 60 near the pupil are equivalent. The illumination units A and B need not form the same illumination distribution on the optical element 60. It suffices as far as a distribution obtained by superposing the illumination distributions formed by the illumination units A and B and an illumination distribution formed by exposure light 62 is rotationally symmetric.

Figure 6A:
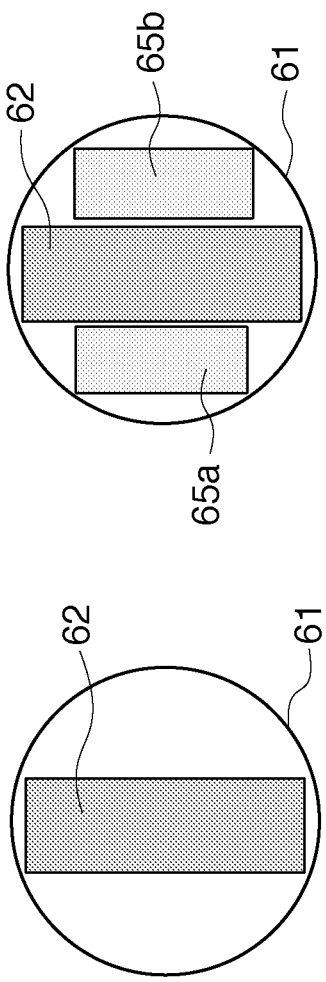
FIGS. 6A to 6E are views each showing an illumination distribution on an optical element near the reticle according to the second embodiment.

According to this embodiment, thermal aberration caused by an asymmetric illumination distribution can be suppressed in an optical element 61 near the reticle (near the original) as well as in the optical element 60 near the pupil simultaneously. When the illumination units A and B are not in use, as the projection exposure apparatus is assumed to be a so-called scanner, an illumination distribution on the optical element 61 near the reticle formed by exposure light 52 will form a rectangle on a round lens, as shown in FIG. 6A.

Figure 6B:
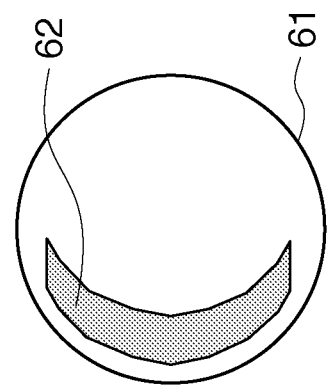

Although an illumination region 62 does not actually form a clear rectangle due to the angular enlargement during illumination, it has almost the same shape as that of the illumination distribution on a reticle 53 formed by the exposure light 52. To form an almost rotationally symmetric illumination distribution on the optical element 61 near the reticle, the non-exposure light may be imparted with illumination distributions 65a and 65b, as shown in FIG. 6B. Although the illumination distributions 65a and 65b have schematically rectangular in this case, their shapes need not be rectangle but can conform to the lens shape. Although the spatial modulation units 58a and 58b are arranged through the bend mirrors 59a and 59b, respectively, they are arranged substantially at positions equivalent to the reticle 53. Therefore, it suffices if the spatial modulation unit 58a is illuminated by the non-exposure light source 57a and an illumination optical system (not shown) to have a distribution with a shape almost the same as that of the illumination distribution 65a. The same relationship is established between the spatial modulation unit 58b and illumination distribution 65b.

Figure 6C:
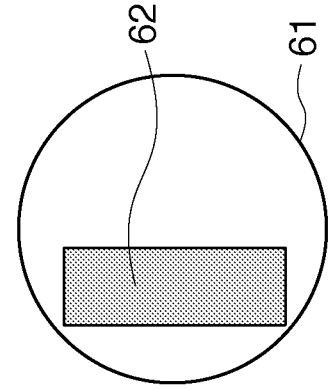
Figure 6D:
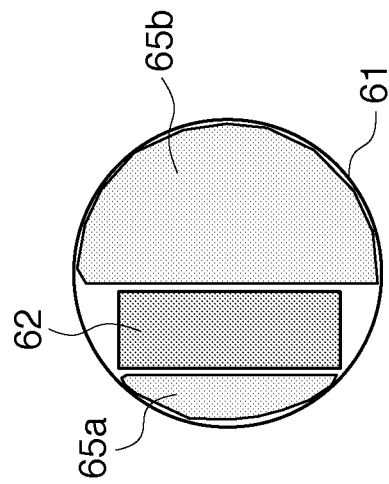
Figure 6E:
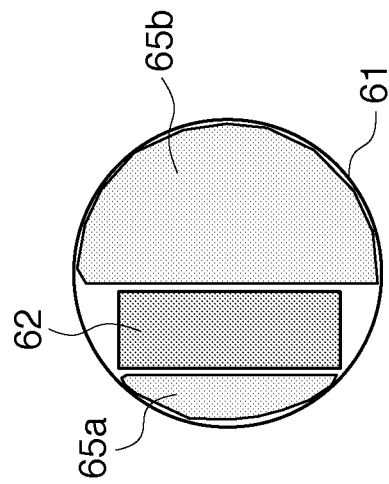

Although the two illumination units A and B are used in this embodiment, the number of non-exposure light illumination units need not be two, but an illumination distribution may be formed by a large number of techniques. Furthermore, as far as absorption by the lens glass material and absorption by a film are similar, the wavelength of the non-exposure light may be the same as that of the exposure light or different from it, or the non-exposure light may have different wavelengths mixed by a plurality of techniques. In particular, in the case of a rectangular illumination region (FIG. 6C) away from the lens center, which is observed in a cata-dioptric projection optical system, or an arcuate illumination region (FIG. 6D) represented by in an EUV illumination exposure apparatus, it is effective if a plurality of illumination units are employed (FIG. 6E).

This embodiment is effective not only for an optical element near the reticle but also for an optical element near the wafer arranged at a position almost conjugate with it to approximate the illumination distribution to be rotationally symmetric. In the case of the cata-dioptric projection optical system or a reflection type projection optical system, however, a portion of the light considered in design, which is other than the portion falling within an illumination range on the reticle, may not reach the optical element near the wafer due to eclipse. In this case, the illumination unit need not be arranged immediately under the reticle but can be arranged at another position to cope with the eclipse. It is desirable if light can enter from the wafer side. In general, however, in a projection exposure apparatus, the distance between the wafer and the final lens is very short, and it is difficult to arrange an illumination unit within this distance. Therefore, desirably, the illumination unit is arranged in the optical path not to interfere with the optical path of the exposure light. For example, when the projection optical system is a cata-dioptric system having a plurality of mirrors, the illumination unit is desirably arranged in the optical path behind a mirror, among the plurality of mirrors, which finally reflects light from the reticle.

Figure 7:
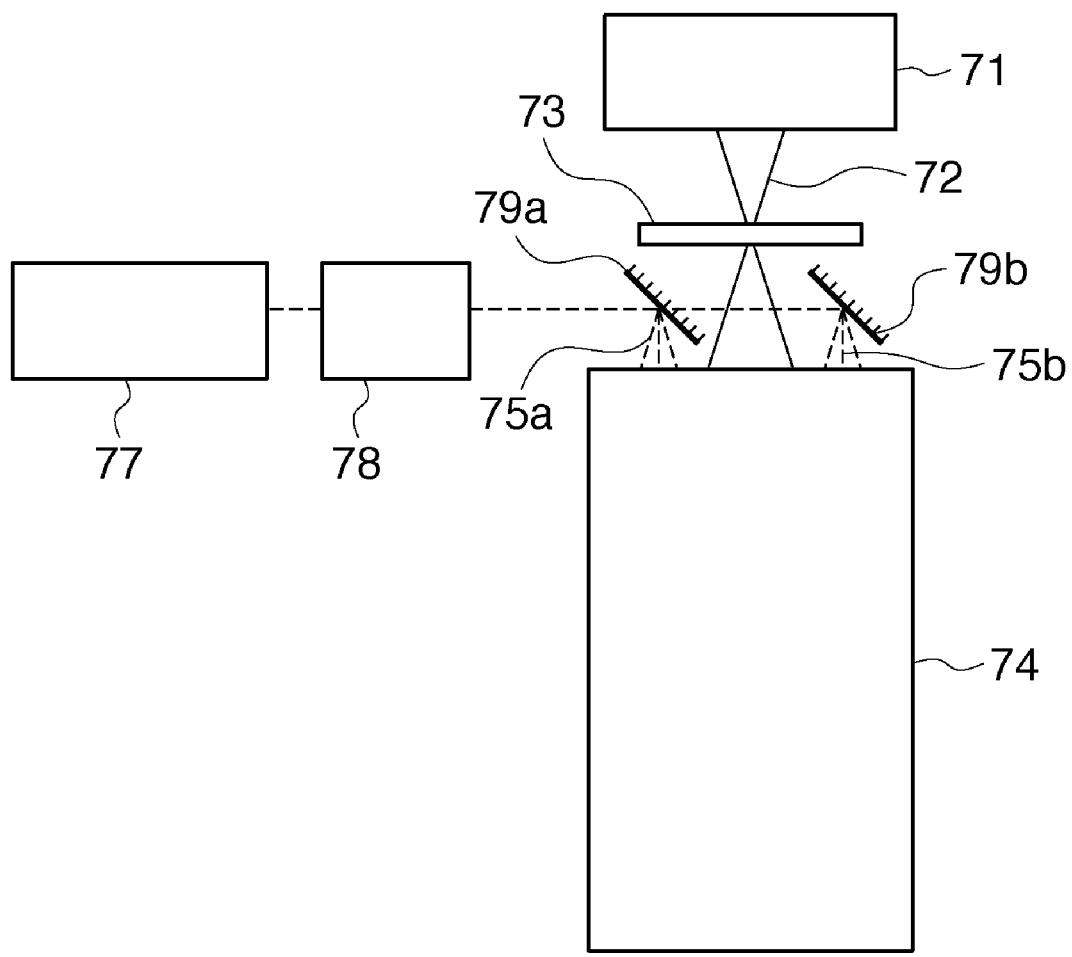
FIG. 7 is a view showing a modification of the second embodiment.

According to another example that implements a function similar to that of this embodiment, as shown in FIG. 7, a non-exposure light source 77 is arranged alone and an optical path split optical system 78 splits the optical path into two or more optical paths to enter a projection optical system 74. Each of units 79a and 79b serves as both a bend mirror and a spatial modulation unit, and can be obtained by combining a reflection type spatial modulation unit or normal spatial modulation unit with a bend mirror.

Third Embodiment

In the second embodiment, illumination is done by a plurality of illumination units, so that the illumination distribution on each of the optical elements near the reticle and wafer becomes approximately rotationally symmetric. In contrast to this, according to the third embodiment, although only one illumination unit is employed, light is controlled to travel back in a projection optical system, thus providing the same effect. In this embodiment, even if non-exposure light employs the same wavelength as that of exposure light, it does not photosensitize a resist on a wafer.

Figure 8:
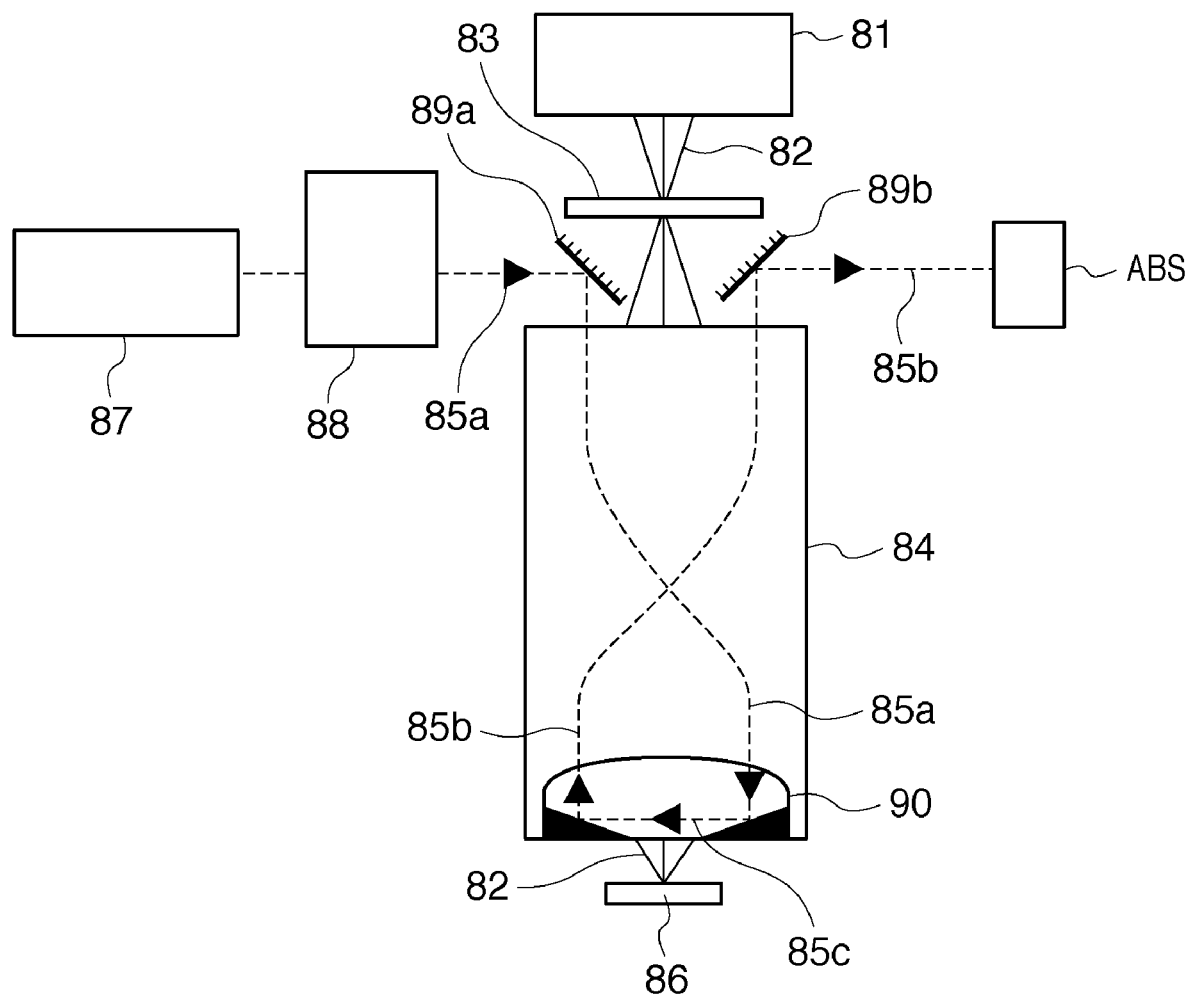
FIG. 8 is a view showing a projection exposure apparatus according to the third embodiment.

FIG. 8 is a schematic view of a projection exposure apparatus and projection optical system according to the third embodiment.

Referring to FIG. 8, non-exposure light 85a emitted by a non-exposure light source 87 and traveling via a spatial modulation unit 88 enters a projection optical system 84 through a bend mirror 89a. At this time, the non-exposure light 85a forms an illumination distribution 105a on an optical element 101 near the reticle shown in FIG. 10A. The non-exposure light 85a further travels in the projection optical system 84 to reach an optical element 90 near the wafer. As the optical element 101 and optical element 90 are almost conjugate, the illumination distribution becomes as shown in FIG. 10B.

The optical element 90 near the wafer comprises an optical path modification unit and guides the non-exposure light 85a entering (traveling forward through) the optical element 90 to travel back as non-exposure light 85b in the projection optical system 84. At this time, the traveling-back non-exposure light 85b forms an illumination distribution 95b on a side opposite to an illumination distribution 95a with respect to an illumination distribution 92 formed by the exposure light. Hence, as a whole, an almost rotationally symmetric illumination distribution can be obtained in the optical element 90. As the non-exposure light 85b travels back in the projection optical system 84 to form an illumination distribution 105b on the optical element 101 near the reticle, an almost rotationally symmetric illumination distribution is formed on the optical element 101 as well. Light passing through the projection optical system 84 must be processed so that it will not form stray light. For example, this light may be diverted from the lens barrel by a bend mirror 89b and absorbed by an absorbing unit ABS.

Figure 9:
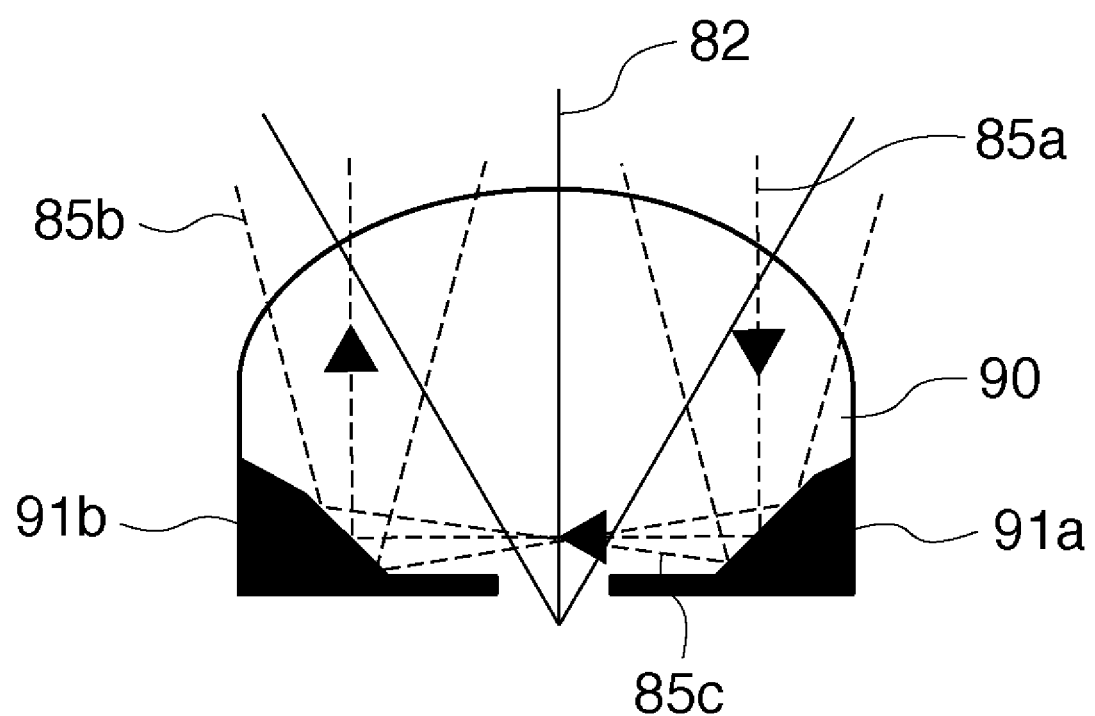
FIG. 9 is an enlarged view of an optical path modification unit according to the third embodiment which causes non-exposure light to travel back.

FIG. 9 is an enlarged view of the optical path modification unit of this embodiment which guides the non-exposure light to travel back.

Referring to FIG. 9, an optical path modification unit 91a reflects the non-exposure light 85a, and an optical path modification unit 91b also reflects the non-exposure light 85a, thus forming the non-exposure light 85b which travels back. Most easily, the reflection surfaces of the optical path modification units 91a and 91b may form planes of 45°. Alternatively, if the reflection surfaces form curved surfaces to give power to the non-exposure light 85b, the non-exposure light 85b will travel back along the correct optical path. The optical path modification units 91a and 91b also serve as light-shielding units so that the non-exposure light will not reach a wafer 86. This is particularly necessary when the wavelength of the non-exposure light is almost the same as that of the exposure light, or when the non-exposure light has such a wavelength that it sensitizes the resist.

The optical element 90 near the wafer incorporates a non-exposure light optical path 85c to guide the non-exposure light to travel back. If the glass material has large absorption, heat is generated as the optical path 85c absorbs light. Since this heat generation occurs throughout almost the entire interior of the optical element 90, it is not against the object of rendering the temperature distribution to be rotationally symmetric. As described above, the same effect can be obtained by the technique of employing a wavelength not largely absorbed by the glass material and causing absorption by the anti-reflection film efficiently, or by causing absorption of light by the optical path modification units 91a and 91b during reflection.

Although the optical element near the reticle and optical element near the wafer are conjugate, in the cata-dioptric projection optical system or reflection type projection optical system, eclipse may occur in the light 85a or 85b. In this case, usually, an intermediate image-forming position is often present which forms an image midway along the optical path. Hence, it suffices if an optical path modification unit is arranged near the intermediate image-forming position. In this case, to cope with optical elements after the intermediate image formation, one or more illumination units and a traveling-back light absorbing unit may be provided.

In the above embodiments, the optical elements of the projection optical elements are lenses. However, the arrangements of the above embodiments can be applied to the mirrors of the projection optical system.

The concept of the modifier of the present invention includes the spatial modulation unit and scanning mirror described above.

[Device Manufacturing Method]

A semiconductor device manufacturing process utilizing an exposure apparatus of one of the above embodiments will be described.

A device (a semiconductor integrated circuit element, liquid crystal display element, or the like) is manufactured by an exposure step of exposing a substrate using the exposure apparatus of one embodiment described above, a developing step of developing the substrate exposed in the exposure step, and other known steps of processing the substrate developed in the developing step. The other known steps include etching, resist removal, dicing, bonding, packaging, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-169487, filed Jun. 27, 2007, which is hereby incorporated by reference herein in its entirety.

What is claimed is:

1. An exposure apparatus which exposes a substrate with exposure light, comprising:
    a projection optical system which projects a pattern image of an original onto the substrate;
    a first illumination unit which illuminates the original with the exposure light using a modified illumination; and
    a plurality second illumination unit which guides illumination light that is different from the exposure light for exposing the substrate to said projection optical system,
    wherein said second illumination unit includes a modifier which changes an illumination distribution of the illumination light transmitting through an optical element near a pupil of said projection optical system and an optical element which is the closest to the original in said projection optical system,
    wherein the modifier forms a rotationally symmetric illumination distribution based on the illumination distribution formed by said first illumination unit, as a sum of an illumination distribution formed by the plurality of second illumination units and an illumination distribution formed by said first illumination unit, on said optical element near the pupil of said projection optical system and on said optical element which is the closest to the original in said projection optical system.

2. The apparatus according to claim 1, wherein said modifier comprises a diffractive optical elements.

3. The apparatus according to claim 1, wherein said second illumination unit includes a beam splitter which splits the illumination light into two beams.

4. An exposure apparatus which exposes a substrate with exposure light, comprising:
    a projection optical system which projects a pattern of an original onto the substrate;
    a first illumination unit which illuminates the original with the exposure light using a modified illumination;
    a second illumination unit which guides illumination light from a light source different from that of the exposure light to said projection optical system; and
    an optical path modification unit which modifies a traveling direction of the illumination light, emerging from said second illumination unit and entering said projection optical system, from toward the substrate to toward the original,
    wherein said second illumination unit includes a modifier which changes an illumination distribution of the illumination light transmitting through an optical element near a pupil of said projection optical system and an optical element which is the closest to the original in said projection optical system, and
    wherein an illumination distribution as a sum of an illumination distribution formed by light traveling forward toward the substrate and an illumination distribution formed by light guided by said optical path modification unit to travel back forms a rotationally symmetric illumination distribution, as a sum with an illumination distribution of the light from said first illumination unit, on an optical element of said projection optical system.

5. A device manufacturing method comprising:
    exposing a substrate using an exposure apparatus according to claim 1; and
    developing the exposed substrate.

6. A device manufacturing method comprising:
    exposing a substrate using an exposure apparatus according to claim 4; and
    developing the exposed substrate.

7. The apparatus according to claim 1, wherein the modifier has a turret and a plurality of computer generated holograms provided with the turret.

8. The apparatus according to claim 1, wherein an intensity of a light from the second illumination unit is changed continuously or to a plurality of levels.

9. The apparatus according to claim 2, wherein the diffractive optical element is a computer generated hologram.

10. The apparatus according to claim 4, wherein said modifier comprises a diffractive optical element.

11. The apparatus according to claim 4, wherein said second illumination unit includes a beam splitter which splits the illumination light into two beams.

12. The apparatus according to claim 4, wherein the modifier has a turret and a plurality of computer generated holograms provided with the turret.

13. The apparatus according to claim 4, wherein an intensity of a light from the second illumination unit is changed continuously or to a plurality of levels.

14. The apparatus according to claim 10, wherein the diffractive optical element is a computer generated hologram.

15. The method according to claim 5, wherein said modifier in the exposure apparatus comprises a diffractive optical element.

16. The method according to claim 5, wherein said second illumination unit in the exposure apparatus includes a beam splitter which splits the illumination light into two beams.

17. The method according to claim 15, wherein the diffractive optical element in the exposure apparatus is a computer generated hologram.

18. The method according to claim 6, wherein said modifier in the exposure apparatus comprises a diffractive optical element.

19. The method according to claim 6, wherein said second illumination unit in the exposure apparatus includes a beam splitter which splits the illumination light into two beams.

20. The method according to claim 18, wherein the diffractive optical element in the exposure apparatus is a computer generated hologram.

* * * * *